United States Patent
Buermann (10) Patent No.: US 6,811,370 B2
(45) Date of Patent: Nov. 2, 2004

(54) WAFER HANDLING ROBOT HAVING X-Y STAGE FOR WAFER HANDLING AND POSITIONING

(75) Inventor: Dale Buermann, Los Altos, CA (US)

(73) Assignee: N&K Technology, Inc., Santa Clara, CA (US)

( * ) Notice: Subject to any disclaimer, the term of this patent is extended or adjusted under 35 U.S.C. 154(b) by 0 days.

(21) Appl. No.: 09/747,201

(22) Filed: Dec. 21, 2000

(65) Prior Publication Data

US 2001/0000721 A1 May 3, 2001

Related U.S. Application Data

(63) Continuation of application No. 09/276,138, filed on Mar. 25, 1999, now abandoned.

(51) Int. Cl.[7] ............................................. G01N 21/01
(52) U.S. Cl. ........................ 414/416.03; 414/226.05; 414/744.4; 414/937; 356/237.5
(58) Field of Search ..................... 414/226.03, 226.05, 414/331.14, 331.18, 416, 744.4, 937, 416.03, 416.08; 901/8, 17, 44; 356/237.5

(56) References Cited

U.S. PATENT DOCUMENTS

| | | | |
|---|---|---|---|
| 3,902,615 A | * | 9/1975 | Levy et al. ............... 414/416 |
| 4,402,613 A | * | 9/1983 | Daly et al. ............. 414/331.14 |
| 4,695,215 A | * | 9/1987 | Jacoby et al. ................ 414/331 |
| 4,818,169 A | * | 4/1989 | Schram et al. ......... 414/331.18 |
| 4,886,412 A | * | 12/1989 | Wooding et al. ............ 414/416 |
| 4,901,011 A | * | 2/1990 | Koike et al. ................ 324/158 |
| 4,907,931 A | * | 3/1990 | Mallory et al. ............. 414/416 |
| 5,105,147 A | * | 4/1992 | Karasikov et al. ............ 901/44 |
| 5,479,108 A | * | 12/1995 | Cheng ................... 414/331.14 |
| 6,130,490 A | * | 10/2000 | Lee ............................ 414/935 |
| 6,164,894 A | * | 12/2000 | Cheng .................... 414/416.03 |

* cited by examiner

*Primary Examiner*—James W. Keenan
(74) *Attorney, Agent, or Firm*—Lumen Intellectual Property Services, Inc.

(57) ABSTRACT

An apparatus for handling and positioning wafers or other flat objects. The apparatus has an XY stage with an X-drive and a Y-drive, and a bed attached to the XY stage. A chuck (e.g. a vacuum chuck) is disposed on the bed and an effector is attached to the bed. The effector can rotate about an axis of rotation extending in the Z-direction. The effector can pick up objects and place the objects onto the chuck. The effector can also pick up objects from the chuck. Preferably, the chuck has a recessed region for accommodating the effector so that the effector can be inserted under a flat object on the chuck. The X-drive or Y-drive of the XY stage provides linear motion for the effector so that the effector can pull wafers from a cassette such as used in the semiconductor industry. Alternatively, the effector is attached to a linear actuator disposed on the bed.

11 Claims, 10 Drawing Sheets

# WAFER HANDLING ROBOT HAVING X-Y STAGE FOR WAFER HANDLING AND POSITIONING

CROSS-REFERENCE TO RELATED APPLICATIONS

This application is a continuation of patent application Ser. No. 09/276,138 filed Mar. 25, 1999, now abandoned, which is herein incorporated by reference.

FIELD OF THE INVENTION

This invention relates generally to robots for manipulating semiconductor wafers, flat panel displays, hard drive magnetic storage disks, printed circuitboards or other objects. More particularly, this invention relates to robots which handle wafers and position them accurately using an X-Y stage. The present invention employs an X-Y stage having an effector mounted on the X-Y stage.

BACKGROUND OF THE INVENTION

Robots are commonly used in integrated circuit manufacturing to manipulate and position semiconductor wafers. Manipulation is necessary, for example, when wafers are inspected, tested or processed at a robotic station. Wafers arrive at the station stacked in cassettes, and a robot removes the wafers from the cassette one at a time for testing. In many testing procedures, the wafers are placed on an X-Y stage by the robot. The X-Y stage accurately positions the wafer with respect to an inspection/testing apparatus which performs measurements at precisely defined points on the wafer.

Examples of inspection/testing procedures include thin film quality and thickness measurements, stress measurements, or other measurements. Often, the measurements are optical.

At a robotic station, several cassettes are often used. For example, there may be a cassette for incoming wafers, a cassette for outgoing wafers, and a cassette for flawed wafers. The robot must be able to move wafers among all the cassettes as well as the X-Y stage. For this, the robot must have several degrees of freedom. Typically, the robot is capable of Z-motion, rotational motion (sometimes about two axes-one fixed, one movable), and linear motion. U.S. Pat. Nos. 4,695,215 and 5,105,147 show relevant examples of robots capable of moving wafers between several cassettes and a testing apparatus.

A problem with many prior art robotic testing stations is that the robots used are expensive and relatively large. It is important for all manufacturing equipment to be as small as possible because cleanroom space in a wafer fab is expensive. It would be an advance in the art of integrated circuit manufacturing equipment to provide a wafer handling apparatus that has a reduced size and cost.

OBJECTS AND ADVANTAGES OF THE INVENTION

Accordingly, it is a primary object of the present invention to provide a wafer handling apparatus that:
1) has a reduced size compared to prior art wafer handling and positioning devices;
2) has a reduced cost compared to prior art wafer handling and positioning devices;
3) is compatible with many different types of testing and processing stations.

These and other objects and advantages will be apparent upon reading the following description and accompanying drawings.

SUMMARY OF THE INVENTION

These objects and advantages are attained by an apparatus for handling and positioning a flat object delivered in a cassette. The cassette holds the object in the XY plane. The apparatus has a mounting means for mounting the cassette, an XY stage having an X-drive, a Y-drive, and a bed. The apparatus also has an effector and a chuck. The X-drive and Y-drive can move the bed in the X and Y directions, respectively. The effector is attached to the bed and can rotate about a Z-axis with respect to the bed. The chuck is attached to the bed. The chuck and effector are located such that the effector can place a flat object onto the chuck. The XY stage is located with respect to the mounting means such that the X-Y stage can cause the effector to pull the flat object from the cassette.

The apparatus may also have a second effector attached to the bed, with the second effector being rotatable with respect to the bed. The effectors can also be movable in the Z-direction. In a particular embodiment, the effectors can move in the Z direction between two discrete Z positions.

Preferably, the chuck is a vacuum chuck. The effector may also have holes for engaging the flat object with vacuum. Also, the chuck may be movable in the Z-direction. Preferably, the chuck has a recessed region for receiving the effector when the effector places a flat object on the chuck.

The present invention also includes an XY stage having an X-drive, a Y-drive, a bed, an effector and a chuck. The bed is attached to the X-drive and Y-drive so that the bed is movable by the X and Y drives. The effector is attached to the bed and is capable of rotation about a Z-axis with respect to the bed. The chuck is also attached to the bed and is disposed such that the effector can place flat objects onto the chuck, and remove objects from the chuck.

The XY stage may also include a second effector. Also, the chuck may have a recessed region for accommodating the effector.

Alternatively, the effector can move linearly with respect to the bed. In this embodiment, the effector is not rotatable.

DETAILED DESCRIPTION

The present invention uses an X-Y stage for both wafer handling and wafer positioning (i.e. positioning relative to a testing apparatus). An end effector arm is located on the X-Y stage and can place a withdrawn wafer on the X-Y stage. An X- or Y-drive of the X-Y stage provides the motion necessary for withdrawing a wafer from a cassette. In this way, the number of mechanical parts, and the cost of a robotic testing/processing station is reduced.

Figure 1:
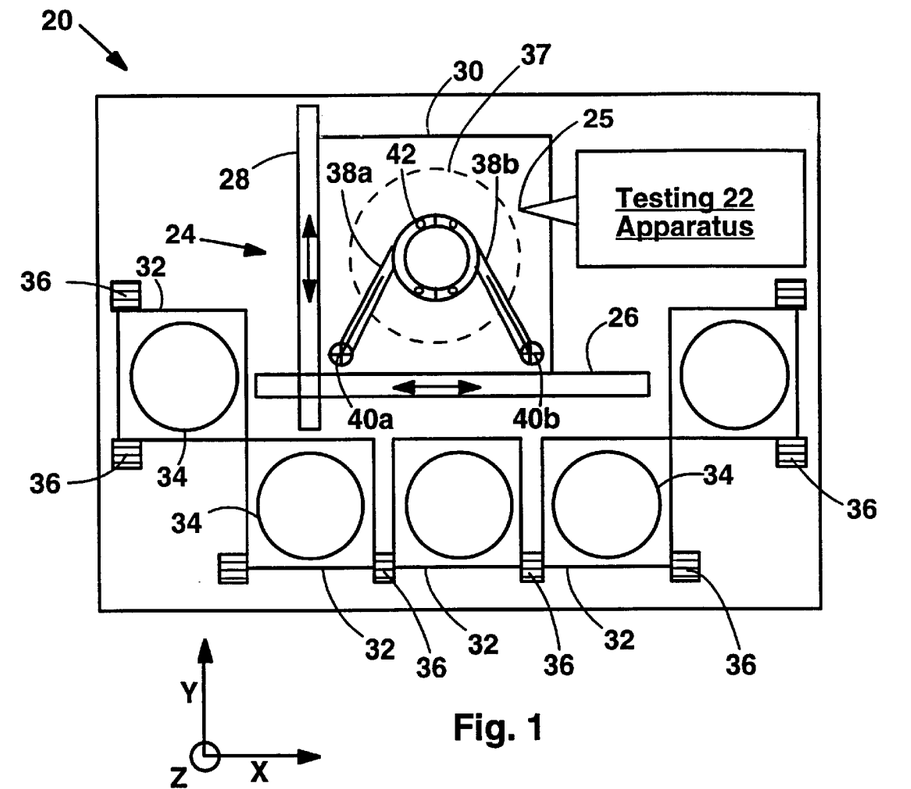
FIG. 1 shows a top view of a wafer handling and positioning apparatus according to the present invention.

FIG. 1 shows a top view of a robotic wafer handling and positioning system 20 according to the present invention. The system 20 handles and accurately positions wafers 34 relative to a testing apparatus 22. The testing apparatus 22 may have a probe 25 for testing precisely defined points on the wafers 34. The wafer handling system includes an X-Y stage 24 which has an X-drive 26, a Y-drive 28, and a bed 30. The drives 26, 28 are linear actuators (e.g. stepper motors driving threaded rods or the like) that can move the bed 30 in X and Y directions, respectively. A vacuum chuck 37 is disposed on the bed 30. The vacuum chuck is designed to accept and hold wafers 34. Located around the X-Y stage are several cassettes 32 loaded with wafers 34. The cassettes are held in place by mounts 36 designed to accurately fix the location of cassettes 32. The cassettes 32 are removable from the system 20.

Attached to the bed 30 are first and second effectors 38a, 38b. Each effector can rotate about an associated Z-axis 40a, 40b. Each effector can also move in the Z-direction to lift and drop wafers from and onto the vacuum chuck 37. Each effector 38a, 38b has holes 42 connected to a vacuum source for engaging wafers 34. Effectors 38a, 38b are necessarily attached to the bed 30 so that they may be moved by the drives 26, 28.

Figure 2A:
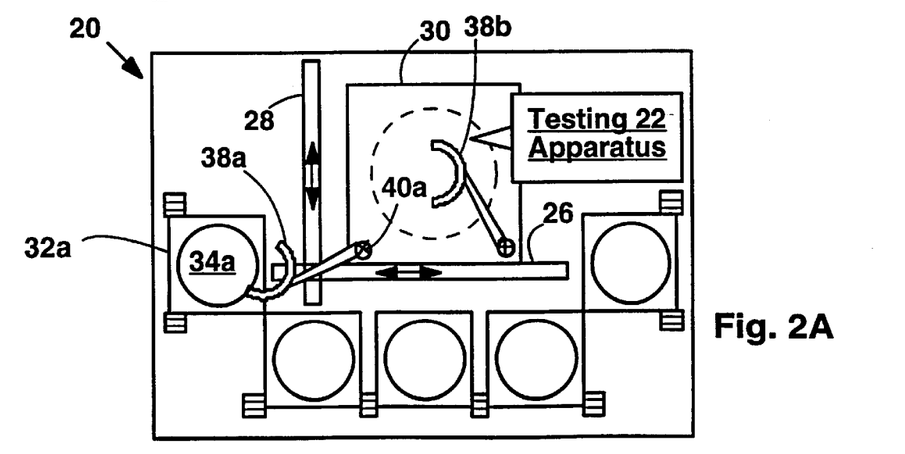
FIGS. 2A–2E illustrate how the apparatus of FIG. 1 handles wafers.
Figure 2B:
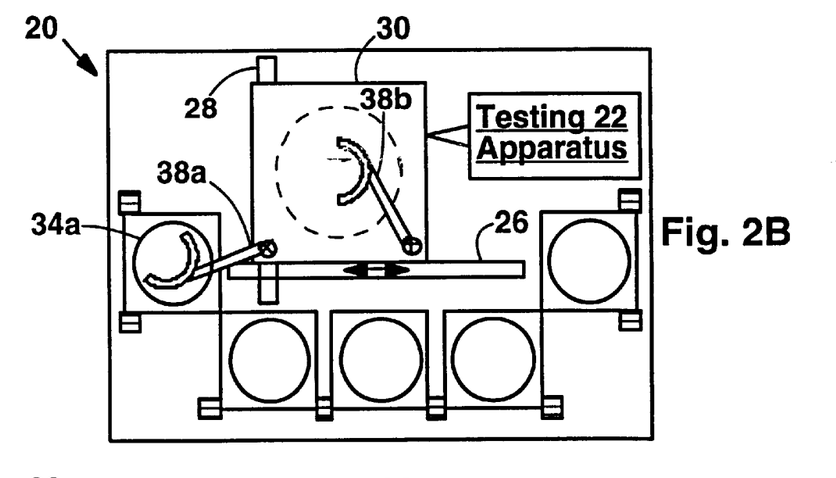

FIG. 2A shows a first step for handling wafers with the present system. The bed 30 is moved to the right and the first effector 38a is rotated about axis 40a counterclockwise so that the effector 38a is in position to pick up wafer 34a. FIG. 2B shows the next step for picking up wafer 34a. X-drive 26 moves the bed 30 and first effector 38a so that the effector 38a is in position under the wafer 34a. For clarity, wafer 34a is shown as transparent. The effector 38a engages the wafer using vacuum from holes 42 (not shown). Effector 38a may also lift slightly (i.e. in the Z-direction, out of page) to pick up wafer. Alternatively, the cassette 32a may be lowered slightly (while effector 38a remains stationary) so that wafer 34a is lowered onto first effector 38a. Elevator devices for raising and lowering cassettes 32 are known in the art.

Figure 2C:
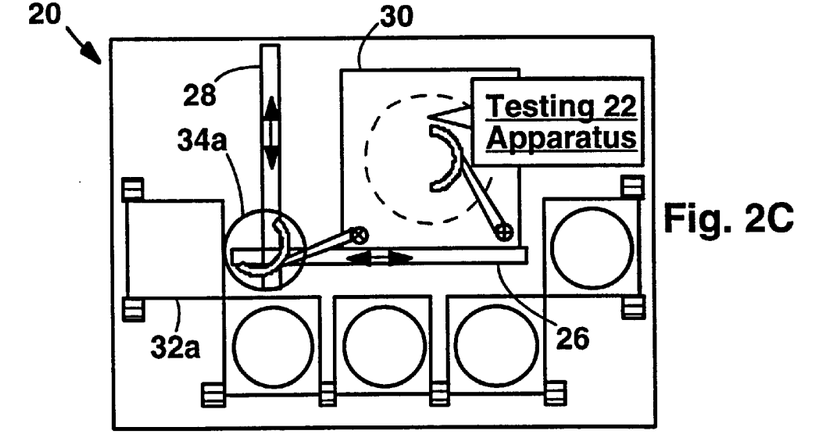
Figure 2D:
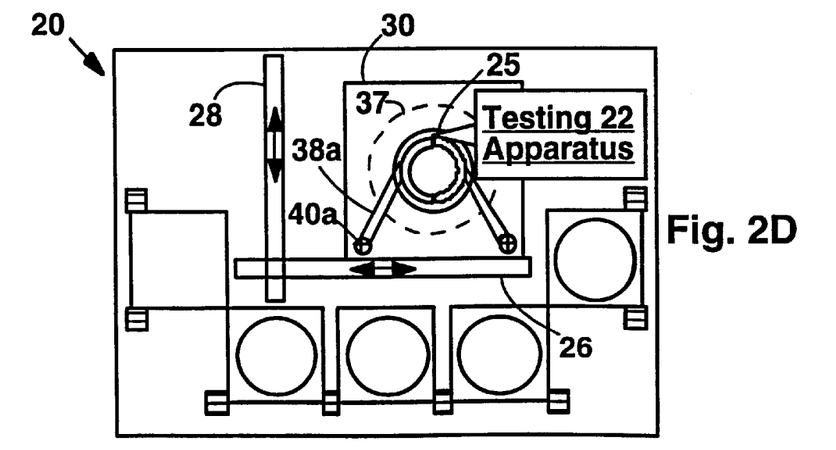

Next, in FIG. 2C, the X-drive reverses and causes effector 38a to pull the wafer 34a from the cassette 32a. The important point here is that the pulling motion is provided by the X-Y stage 24 (more specifically the X-drive 26). Next, in FIG. 2D, the first effector rotates about axis 40a and places the wafer onto chuck 37. Once the wafer 34a is placed on chuck 37, the drives 26, 28 are used to accurately position the wafer 34a with respect to the testing apparatus 22 and probe 25. It is understood that the effectors 38a, 38b are located beneath the wafer 34a.

In the present system, the drives 26, 28 provide, in essence, two functions: first, the drives provide the linear motion necessary for removing/inserting wafers from/into the cassettes; second, the drives provide the motion necessary for accurate positioning of wafers relative to the testing apparatus 22. In this way, the required number of mechanical parts, actuators and the like is minimized. There is no need for both a handling robot and a separate X-Y stage (as in prior art machines). In the present system 20, the functions of both are provided by the X-Y stage 24 and effectors 38a, 38b.

Figure 2E:
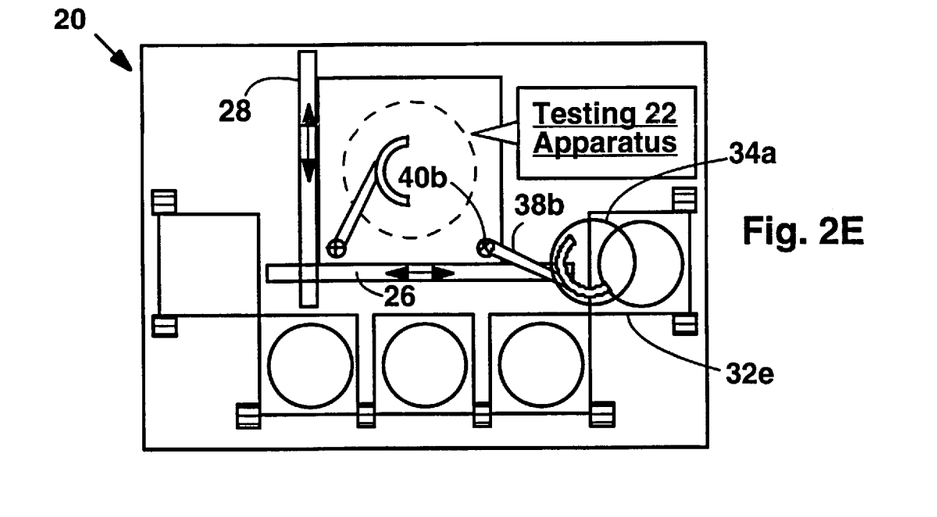

FIG. 2E illustrates that second effector 38b may be used to remove wafer 34a from the chuck 37. Appropriate control of drive 26 causes second effector 38b to place wafer 34a in cassette 32e.

It is understood that X-Y stages typically have a range of motion at least as great as a diameter of the wafers with which they are used. This is a necessary requirement for accessing all the points on the wafer with the testing apparatus 22. Given that this is the case, the X-Y stage 24 will have a range of motion great enough to pull the wafer 34 completely out of the cassettes 32.

Figure 3:
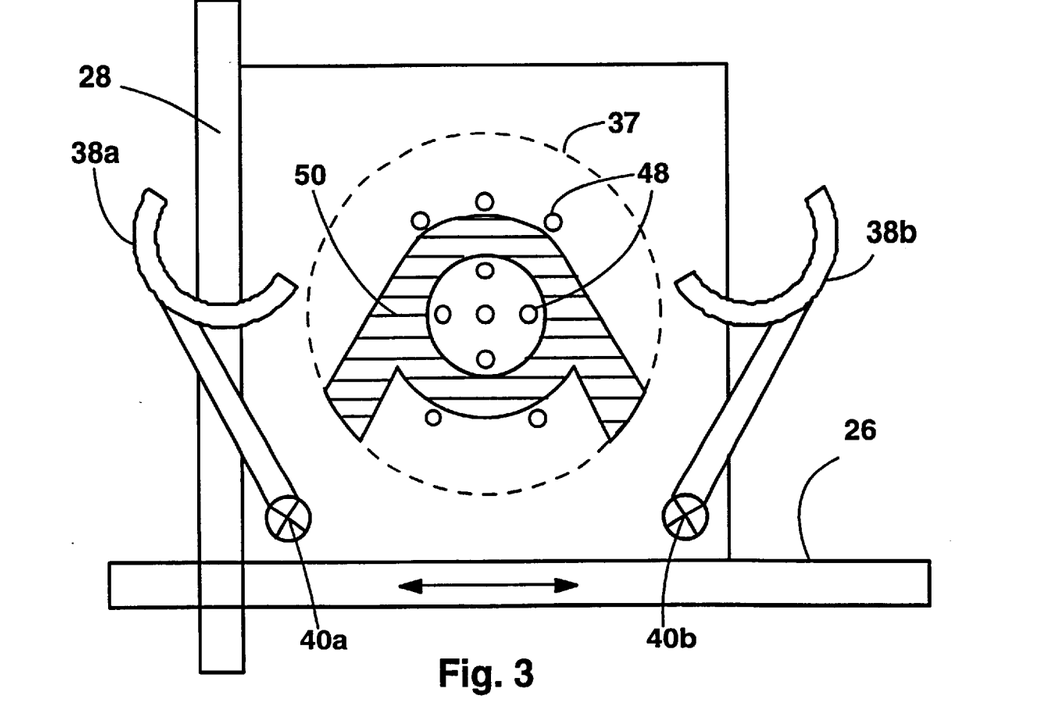
FIG. 3 shows a top view of the XY stage of the apparatus of FIG. 1.

FIG. 3 shows a closeup top view of the bed 30 and effectors 38a, 38b. Vacuum chuck 37 has a flat top surface with vacuum holes 48. Vacuum chuck 37 also has a recessed region 50 shaped to accept the effectors 38a, 38b so that the wafer may be placed directly on a top surface of the vacuum chuck 37.

Although the present invention has been mainly described as having two effectors, it is possible for the system to have only one effector attached to the bed 30.

Figure 4:
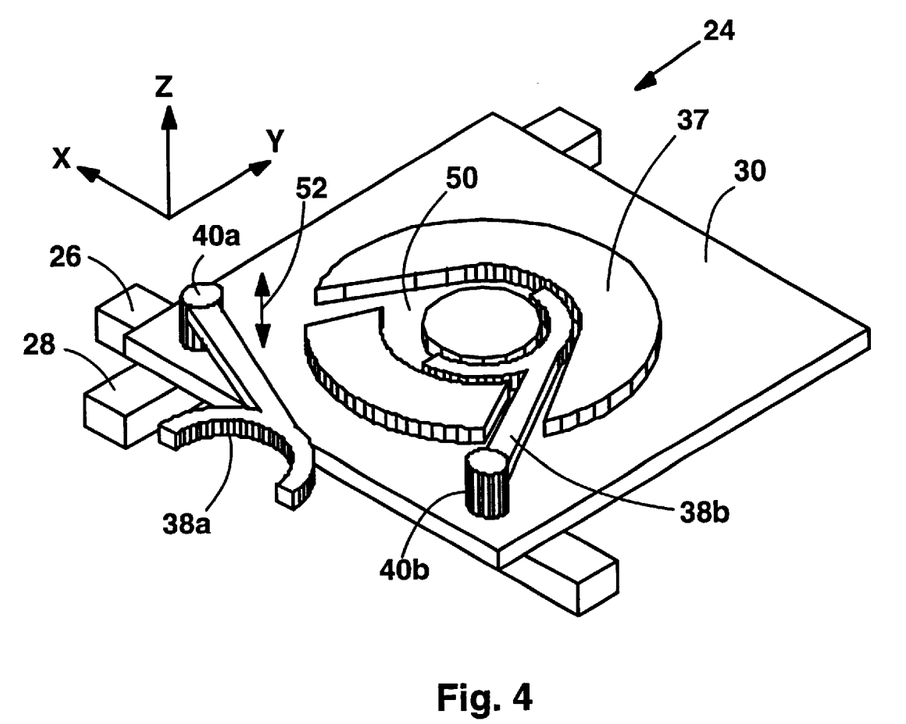
FIG. 4 shows a perspective view of the XY stage of the apparatus of FIG. 1.

FIG. 4 shows a perspective view of the X-Y stage 24 and effectors 38a, 38b. The effectors 38a, 38b can move in the Z-direction 52 by sliding along the axes 40a, 40b. Z-motion allows the effectors to drop into recessed region 50 when placing a wafer on the vacuum chuck 37.

Figure 5:
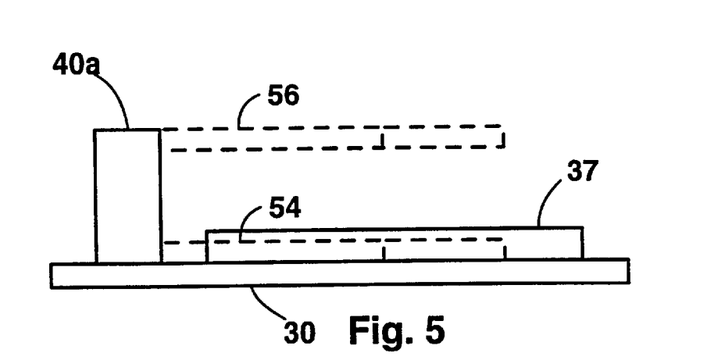
FIG. 5 shows a side view of the XY stage, illustrating how the effectors can move between two discrete Z positions.

FIG. 5 shows a side view of an X-Y stage 24 illustrating a specific implementation of Z-direction motion. The effector 38a can move between two discrete Z-positions: a lower Z-position 54 and a higher Z-position 56. The lower Z-position 54 is lower than the chuck 37. The higher Z-position is higher than the chuck 37. This allows the effector 38a to place the wafer 34 directly onto the chuck 37, and to lift the wafer from the chuck. Motion between two discrete positions can be accomplished using a pneumatic piston or a solenoid actuator with mechanical stops, for example.

Figure 6:
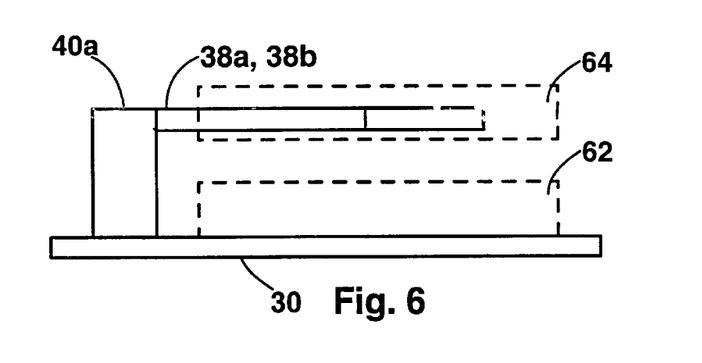
FIG. 6 shows a side view of the XY stage, illustrating how, in an alternative embodiment, the chuck can move between two discrete Z positions.

FIG. 6 shows a side view of an alternative embodiment of an X-Y stage. Here, the effectors 38a, 38b cannot move in the Z-direction. Instead, the chuck 37 can move in the Z-direction with respect to the bed 30. FIG. 6 shows two discrete positions for the chuck: a lower Z-position 62 and a higher Z-position 64. In this embodiment, Z-motion of the chuck is used to pick up wafers from the effectors 38a, 38b and place wafers onto the effectors. The wafer 34 rests upon the chuck when the chuck is in the higher z position 64. The wafer 34 rests upon the effectors when the chuck is in the lower Z position 62. The effectors do not need to be able to move in the Z-direction in this embodiment.

Although the present invention has been illustrated with effectors having a semicircular shape, the effectors can have any shape. Effectors commonly used on the semiconductor industry have a paddle-like, rectangular shape. Such effectors can be used in the present invention.

Figure 7:
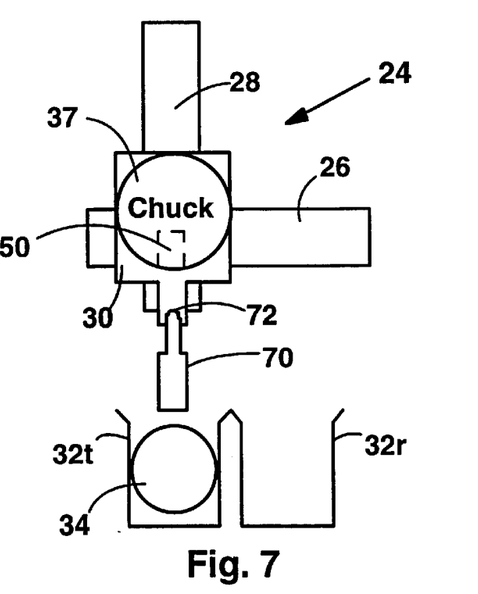
FIG. 7 shows a top view of an alternative XY stage (and cassettes) according to the present invention.

FIG. 7 shows another example of the present invention which employs a single, paddle-shaped end effector 70 which can rotate about Z-axis 72. The chuck 37 has a recessed region 50 for receiving the effector 70. Cassettes 32b, 32d holding wafers 34 are disposed near the X-Y stage.

FIGS. 8A–8F are top views which illustrate how the device of FIG. 7 can move wafers between the cassettes 32t, 32r. First, in FIG. 8A, the Y-drive 28 moves the bed 30, chuck 37 and effector 70 towards the cassettes so that the effector 70 is under the wafer 34. The effector 70 may engage the wafer 34 using vacuum as is known in the art. The effector moves in the Z-direction (i.e. out of the page) in order to lift the wafer 34 from its slot in the first cassette 32t. Alternatively, the cassettes 32 is lowered slightly by an elevator device to place the wafer on the effector.

Figure 8A:
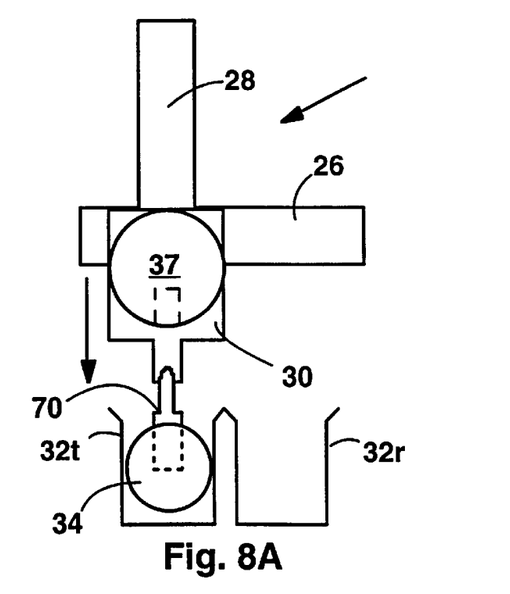
FIGS. 8A–8F illustrate how the apparatus of FIG. 7 handles wafers.
Figure 8B:
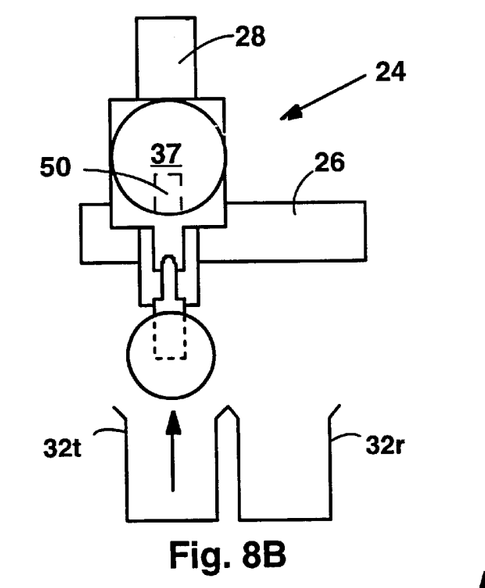
Figure 8C:
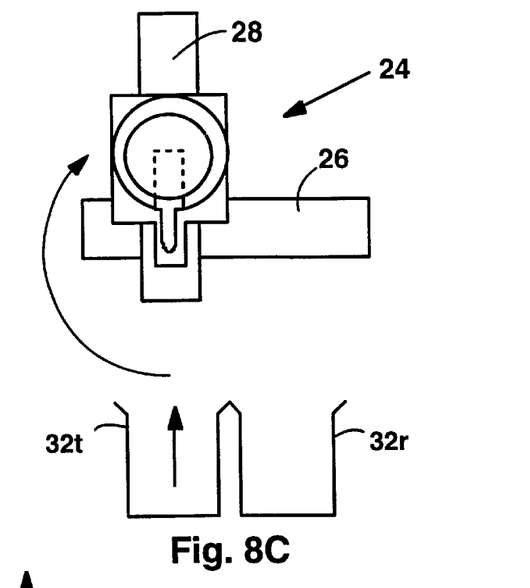

Next, in FIG. 8B, the Y-drive 28 retracts, pulling the wafer 34 from the first cassette 32t. In FIG. 8C, the effector 70 rotates 180° around Z-axis and places wafer 34 onto chuck 37. In order to place wafer onto the chuck, the effector may be lowered in the Z-direction into the recessed region 50 (i.e. moved into the page), or the chuck may be raised in the Z-direction (i.e. moved out of the page). Once the wafer 34 is on the chuck, the X-Y stage can accurately position and move the wafer for inspection, analysis or further processing.

Figure 8D:
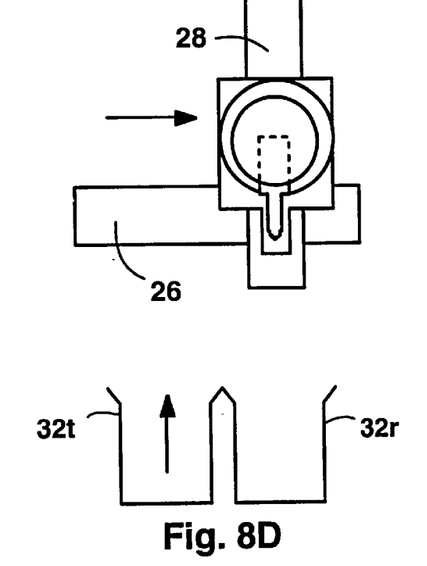
Figure 8E:
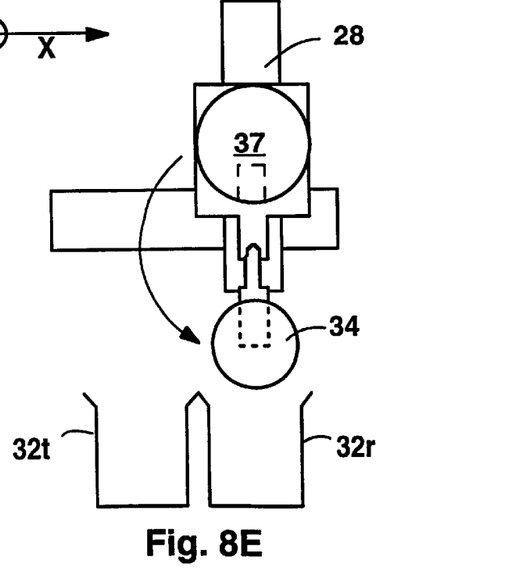

In FIG. 8D, the X-drive 26 moves the bed, chuck and effector in the X-direction so that the effector is aligned with the second cassette 32r. Then, in FIG. 8E, the effector is raised from the recessed region 50 and rotates again, removing the wafer 34 from the chuck. Alternatively, the chuck 37 can move downward (in the Z-direction) so that the wafer is lifted from the chuck and supported by the effector.

Figure 8F:
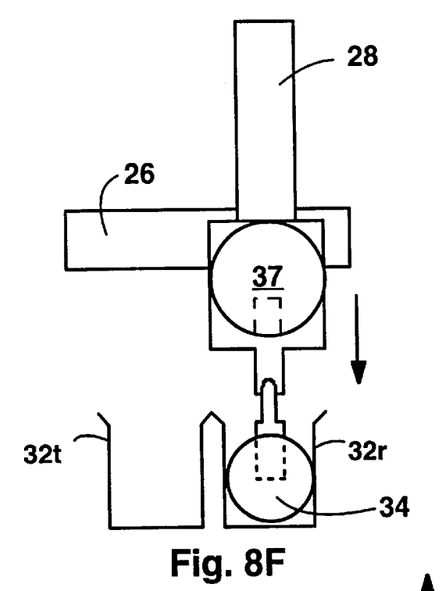

Finally, in FIG. 8F, the Y-drive 28 pushes the wafer into the second cassette 32r. At this point, the effector may be lowered so that the wafer is supported by the cassette. Alternatively, the second cassette 32r may be raised to lift the wafer from the effector. Raising and lowering of the second cassette 32r can be accomplished using a cassette elevator as is known in the art.

Figure 9:
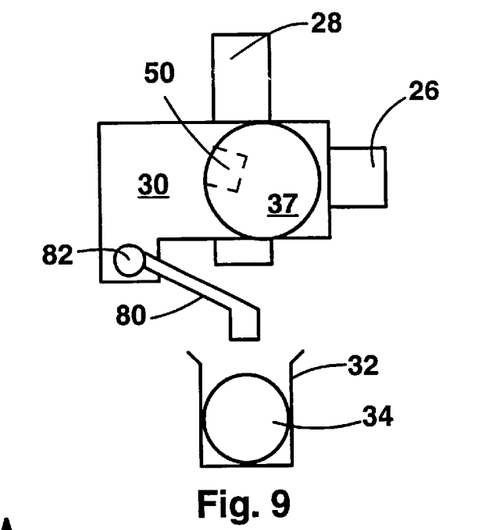
FIG. 9 shows a top view of an embodiment (and cassette) having an effector displaced to the side.
Figure 9A:
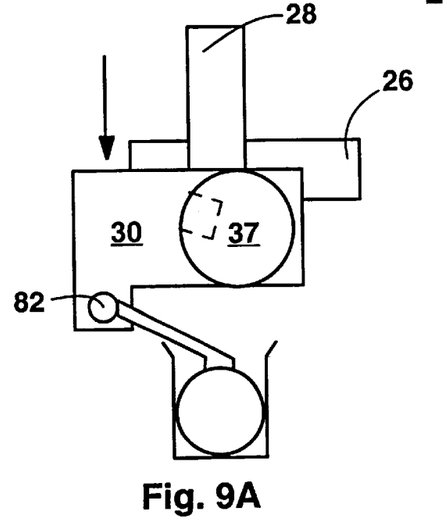
FIGS. 9A–9C illustrate how the apparatus of FIG. 9 handles wafers.
Figure 9B:
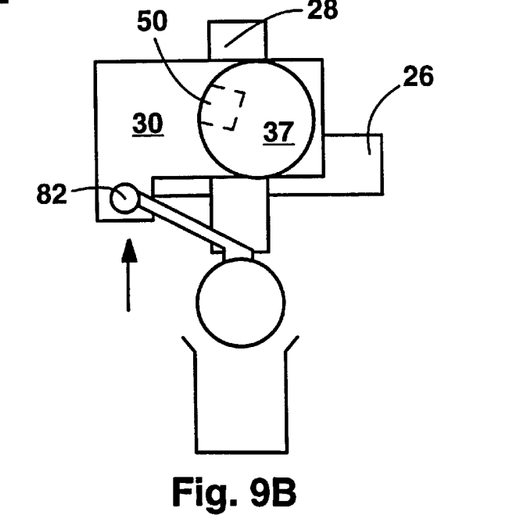
Figure 9C:
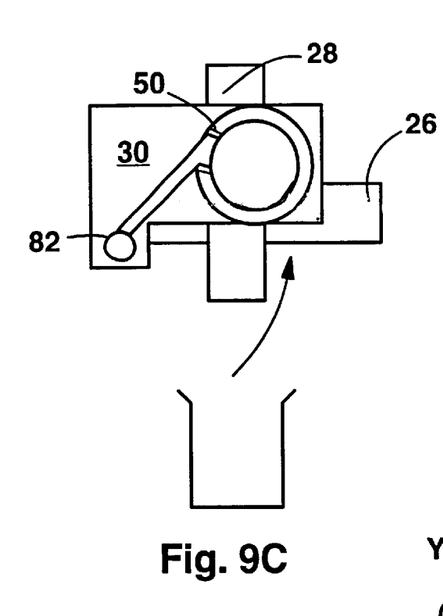

FIG. 9 shows yet another embodiment of the present invention in which an effector 80 is elongated and displaced to the side of the chuck 37. The effector 80 can rotate about a Z axis of rotation 82. FIGS. 9A–9C illustrate how the effector is used to remove a wafer 34 from the cassette 32 and place the wafer onto the chuck 37. Effector 80 is lowered into recessed region 50 when placing wafers on the chuck.

Figure 10:
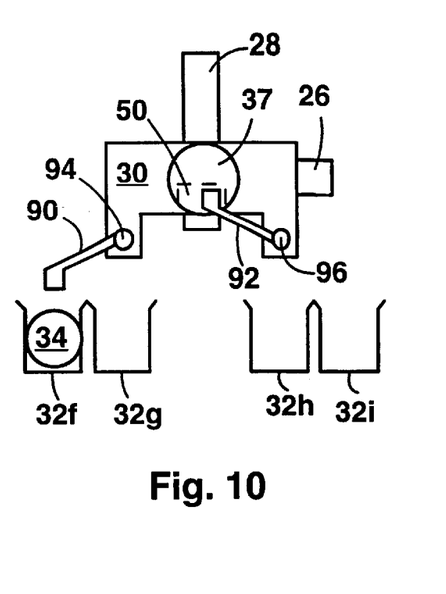
FIG. 10 shows a top view of an XY stage (and cassettes) where the stage has two effectors.
Figure 10A:
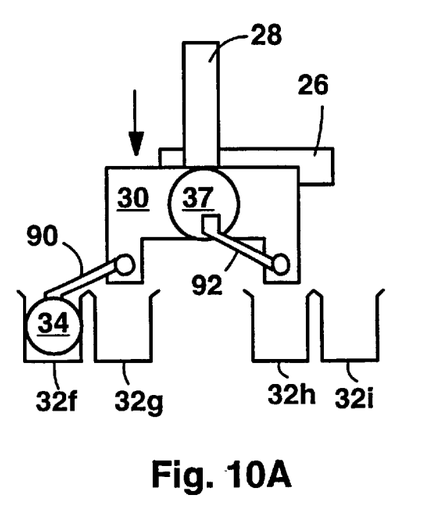
FIGS. 10A–10D illustrate how the apparatus of FIG. 10 handles wafers.
Figure 10B:
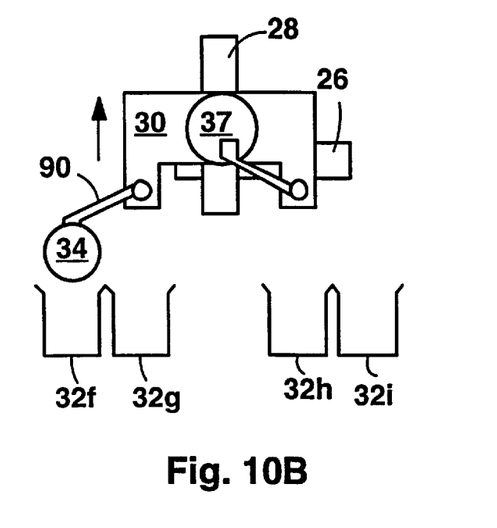
Figure 10C:
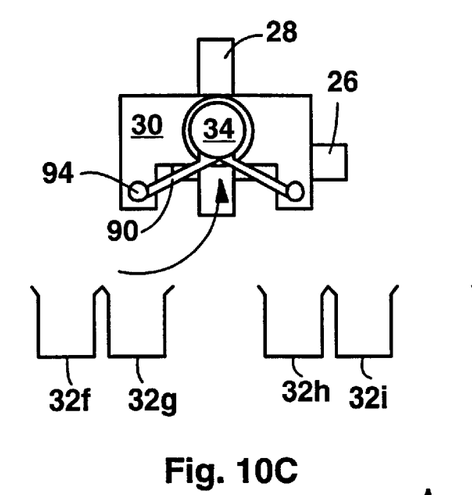
Figure 10D:
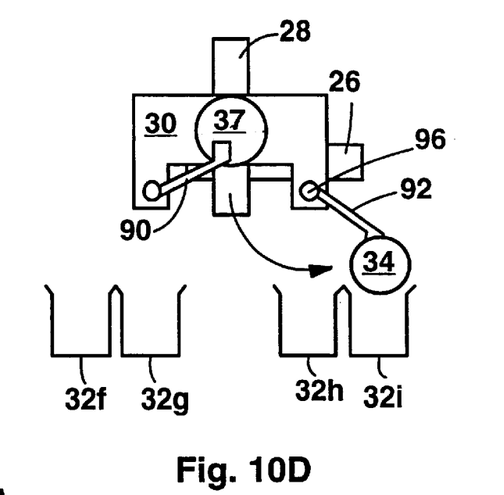

FIG. 10 shows yet another embodiment of the present invention which has two elongated effectors 90, 92 attached to the bed 30. Two effectors provide an increased range of motion for handling wafers. Each effector 90, 92 can rotate about an associated Z-axis of rotation 94, 96. FIGS. 10A–10C illustrate how the robot of FIG. 10 can move wafers between the cassettes 32f–32i and chuck 37. In FIG. 10A, the Y-drive 28 moves the bed 30 and effector 90 so that the effector 90 can engage the wafer 34. The effector 90 may then lift slightly to pick up the wafer 34. Next, in FIG. 10B the Y-drive 28 reverses, and the wafer 34 is pulled from the cassette 32f. In FIG. 10C, the effector 90 rotates about axis 94 and places the wafer onto the chuck 37. In FIG. 10D, second effector 92 picks up wafer 34 and rotates about axis 96 to align the wafer with cassette 32i. X-drive 26 may move the bed 30 and effectors 90, 92 in the X-direction so that wafers may be pulled from or inserted into any of the cassettes 32f, 32g, 32h, 32i.

In the present invention, it is possible for the cassettes (e.g. cassettes 32f–32i) to be placed on a conveyor belt moving past the XY stage. The conveyor belt may, for example (e.g. in the example of FIGS. 10A–10C) continuously or intermittently move the cassettes in the X-direction past the XY stage. As the cassettes move past the XY stage, the effectors remove wafers from the cassettes one at a time for processing and replace the wafers into the cassettes after processing.

Figure 11:
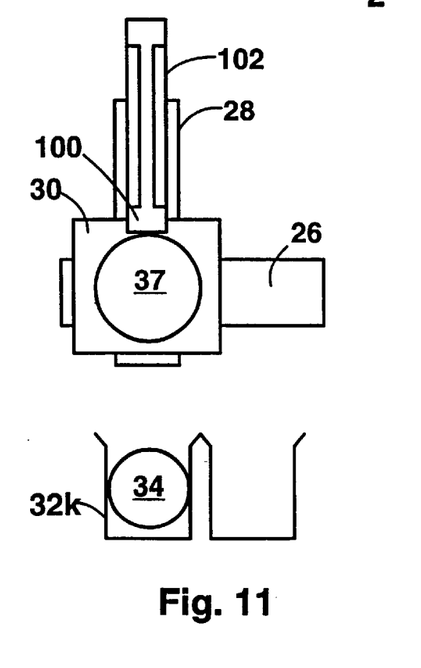
FIG. 11 shows a top view of an alternative embodiment where the effector is moved by a linear actuator.
Figure 11A:
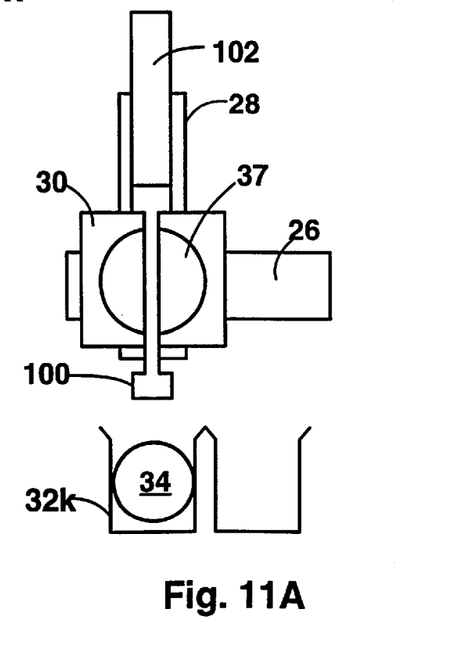
FIGS. 11A–11E illustrate how the apparatus of FIG. 11 handles wafers.
Figure 11B:
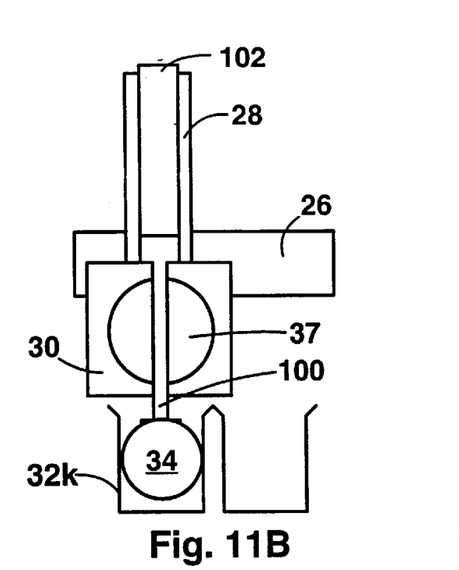
Figure 11C:
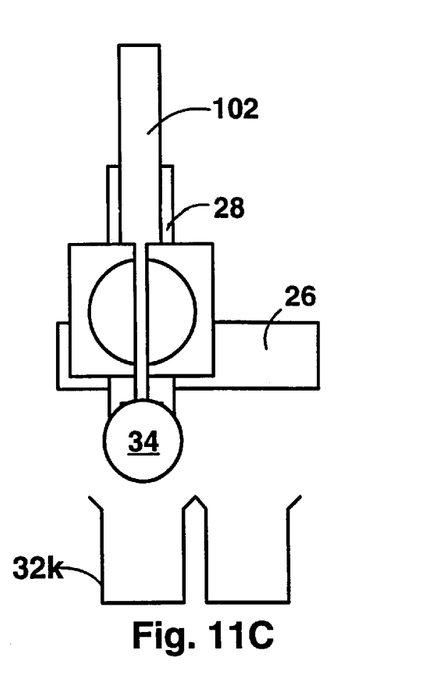
Figure 11D:
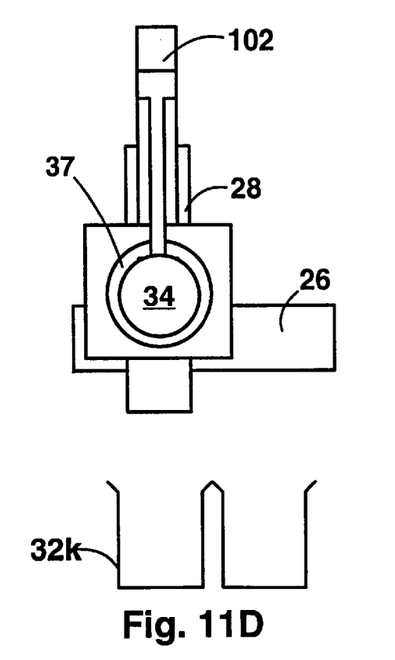
Figure 11E:
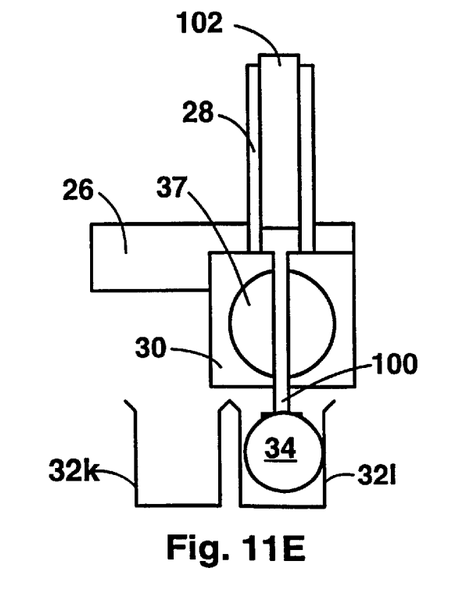

FIG. 11 shows yet another embodiment of the present invention in which an effector 100 is controlled by a linear actuator 102. The effector 100 is not capable of rotation. The linear actuator 102 is attached to the bed 30, and so can be moved by the Y-drive 28 and X-drive 26. The linear actuator may move the effector 100 in the Y direction with respect to the bed. FIG. 11A shows a first step in loading a wafer onto the chuck 37 using the device of FIG. 11. The effector 100 is moved in the Y direction toward the cassette 32k with the linear actuator 102. Next, in FIG. 11B, the Y-drive moves the bed 30, linear actuator 102, effector 100 and chuck 37 towards the cassette 32k so that the effector 100 engages the wafer 34. Next, the linear actuator 102 or Y-drive 28 moves the effector 100 to pull the wafer from the cassette 32k. In FIG. 11C the Y drive 28 moves the effector 100 to pull the wafer from the cassette. Next, in FIG. 11D, the linear actuator 102 moves the effector to place the wafer on the chuck 37. Next, in FIG. 11E, the X-drive 26 moves the effector (and other parts) into alignment with second cassette 32l. Then, the Y-drive 28 and linear actuator 102 move the effector 100 to insert the wafer 34 into the second cassette 32l.

In the present invention, the effectors can be rotated using any one of a number of well known rotary actuators. Examples of useful rotary actuators include stepper motors, DC or AC servo motors, and rotary pneumatic actuators. Preferably, the rotary actuator has a position sensing device for sensing the angular position of the effector so that feedback control may be provided. Also, limit switches may be provided for establishing fixed reference positions.

Also, in the present invention, the X-drive and Y-drive can use any kind of linear actuator. Examples of useful linear actuators include stepper motor/worm gear drives, DC servo or AC servo worm gear drives, pneumatic pistons and linear electric motors. Preferably, the X-drive and Y-drive have position sensing devices for sensing the position of the bed so that feedback control may be provided.

Although the present invention has been described mainly in terms of semiconductor wafer processing, the present invention is useful in a broad range of applications. Most generally, the present invention is useful where a number of objects must be individually positioned and processed on an XY stage. The effectors provide for placing and removing objects to a from the XY stage. The X and Y drives provide for accurate positioning as well as motion required for handling the objects. Applications for the present invention extend to processing of flat panel displays, magnetic data storage disks, printed circuit boards and the like.

It will be clear to one skilled in the art that the above embodiment may be altered in many ways without departing from the scope of the invention. Accordingly, the scope of the invention should be determined by the following claims and their legal equivalents.

What is claimed is:

1. An apparatus for handling, positioning and examining a flat object delivered in a cassette that holds the flat object in an X-Y plane, the apparatus comprising:
 a) a mounting means for mounting the cassette;
 b) an X-Y stage having an X-drive, a Y-drive, and a bed, wherein the bed is movable in an X direction and a Y direction by the X-drive and the Y-drive respectively;
 c) an effector for handling the flat object, the effector being attached to the bed and being rotatable about a Z-axis with respect to the bed, the X-Y stage being disposed relative to the mounting means such that the X-Y stage causes the effector to pull the flat object from the cassette mounted in the mounting means; and d) a chuck for receiving and holding the flat object for measurements, the chuck being attached to the bed and disposed such that the effector places the flat object onto the chuck, wherein movements of the bed in the X direction and the Y direction allow the measurements at at least two points on the flat object.

2. The apparatus of claim 1 further comprising a second effector attached to the bed, wherein the second effector is rotatable about a second Z-axis with respect to the bed.

3. The apparatus of claim 2 wherein the second effector is movable in a Z-direction with respect to the bed.

4. The apparatus of claim 3 further comprising a means for moving the second effector between two discrete Z-positions.

5. The apparatus of claim 1 wherein the chuck is a vacuum chuck for receiving flat objects.

6. The apparatus of claim 1 wherein the effector is movable in the Z-direction with respect to the bed.

7. The apparatus of claim 6 further comprising a means for moving the effector between two discrete Z-positions.

8. The apparatus of claim 1 wherein the effector has holes for engaging the flat objects with a vacuum.

9. The apparatus of claim 1 wherein the chuck is movable in the Z-direction.

10. The apparatus of claim 1 wherein the chuck has a recessed region for accommodating the effector.

11. An apparatus for handling, positioning and examining a flat object delivered in a cassette that holds the flat object in an X-Y plane, the apparatus comprising:

a) a mounting means for mounting the cassette;

b) an X-Y stage having at least one of an X-drive and a Y-drive, and a bed, wherein the bed is movable in at least one of an X direction and a Y direction by at least one of the X-drive and the Y-drive respectively;

c) an effector for handling the flat object, the effector being attached to the bed and being rotatable about a Z-axis with respect to the bed, the X-Y stage being disposed relative to the mounting means such that the X-Y stage causes the effector to pull the flat object from the cassette mounted in the mounting means;

d) a chuck for receiving and holding the flat object for measurements, the chuck being attached to the bed and disposed such that the effector places the flat object onto the chuck, wherein movements of the bed in at least one of the X direction and the Y direction allow the measurements at at least two points on the flat object.

* * * * *